(12) United States Patent
Wierzchowiec et al.

(10) Patent No.: US 9,425,417 B2
(45) Date of Patent: Aug. 23, 2016

(54) POLYCYCLOOLEFINIC POLYMER FORMULATION FOR AN ORGANIC SEMICONDUCTOR

(71) Applicant: Merck Patent GmbH, Darmstadt (DE)

(72) Inventors: Piotr Wierzchowiec, Southampton (GB); Pawel Miskiewicz, Cambridge, MA (US); Li Wei Tan, Eastleigh (GB); Rashmi Bhintade, Winchester (GB); Paul Craig Brookes, Acton, MA (US); Larry F. Rhodes, Silver Lake, OH (US); Hugh A. Burgoon, Strongsville, OH (US)

(73) Assignees: Merck Patent GmbH, Darmstadt (DE); Promerus LLC, Brecksville, OH (US)

( * ) Notice: Subject to any disclaimer, the term of this patent is extended or adjusted under 35 U.S.C. 154(b) by 0 days.

(21) Appl. No.: 14/427,520

(22) PCT Filed: Sep. 5, 2013

(86) PCT No.: PCT/EP2013/002671
§ 371 (c)(1),
(2) Date: Mar. 11, 2015

(87) PCT Pub. No.: WO2014/044359
PCT Pub. Date: Mar. 27, 2014

(65) Prior Publication Data
US 2015/0243914 A1  Aug. 27, 2015

Related U.S. Application Data

(60) Provisional application No. 61/704,112, filed on Sep. 21, 2012.

(51) Int. Cl.
*H01L 51/00* (2006.01)
*C09D 145/00* (2006.01)
(Continued)

(52) U.S. Cl.
CPC .......... *H01L 51/0094* (2013.01); *C09D 145/00* (2013.01); *H01L 51/0032* (2013.01);
(Continued)

(58) Field of Classification Search
CPC ............ H01L 51/0094; H01L 51/0541; H01L 51/0545
See application file for complete search history.

(56) References Cited

U.S. PATENT DOCUMENTS 3,622,321 A   11/1971   Smets et al.
4,565,873 A    1/1986   Lohmann et al.
(Continued)

FOREIGN PATENT DOCUMENTS

EP   1687830 A2   8/2006
EP   1933393 A1   6/2008
(Continued)

OTHER PUBLICATIONS

International Search Report for PCT/EP2013/002671 mailed Dec. 2, 2013.
(Continued)

*Primary Examiner* — Mamadou Diallo
(74) *Attorney, Agent, or Firm* — Drinker Biddle & Reath LLP

(57) ABSTRACT

Embodiments in accordance with the present invention relate generally to formulations for use in organic semiconductor layers of organic electronic devices, and more specifically in organic field effect transistors, to organic semiconductor layers prepared from such formulations, and to organic electronic devices and organic field effect transistors encompassing such organic semiconductor layers.

24 Claims, 4 Drawing Sheets

(51) Int. Cl.
*C08K 5/548* (2006.01)
*H01L 51/05* (2006.01)
*H01L 51/10* (2006.01)

(52) U.S. Cl.
CPC ........ *H01L51/0052* (2013.01); *H01L 51/0074* (2013.01); *H01L 51/0541* (2013.01); *H01L 51/0545* (2013.01); *C08G 2261/3424* (2013.01); *C08G 2261/92* (2013.01); *C08K 5/548* (2013.01); *C08L 2203/20* (2013.01); *H01L 51/0003* (2013.01); *H01L 51/0058* (2013.01); *H01L 51/052* (2013.01); *H01L 51/107* (2013.01); *Y02E 10/549* (2013.01)

(56) References Cited

U.S. PATENT DOCUMENTS

| | | | |
|---|---|---|---|
| 5,468,819 | A | 11/1995 | Goodall et al. |
| 5,789,757 | A | 8/1998 | Husson, Jr. et al. |
| 5,861,235 | A | 1/1999 | Harkness et al. |
| 6,040,407 | A | 3/2000 | Ishida et al. |
| 6,538,087 | B2 | 3/2003 | Zhao et al. |
| 6,630,566 | B1 | 10/2003 | Allen et al. |
| 6,690,029 | B1 | 2/2004 | Anthony et al. |
| 6,890,847 | B1 | 5/2005 | Farrar |
| 6,967,436 | B2 | 11/2005 | Park |
| 7,029,945 | B2 | 4/2006 | Veres et al. |
| 7,385,221 | B1 | 6/2008 | Anthony et al. |
| 7,939,819 | B2 * | 5/2011 | Aoki .................. H01L 51/0529 257/40 |
| 8,053,515 | B2 | 11/2011 | Elce et al. |
| 8,637,343 | B2 | 1/2014 | Mueller et al. |
| 2003/0017360 | A1 | 1/2003 | Tai et al. |
| 2005/0186502 | A1 | 8/2005 | Elce et al. |
| 2005/0192409 | A1 | 9/2005 | Rhodes et al. |
| 2006/0020068 | A1 | 1/2006 | Elce et al. |
| 2007/0023837 | A1 | 2/2007 | Lee et al. |
| 2007/0066775 | A1 | 3/2007 | Rhodes et al. |
| 2007/0096088 | A1 | 5/2007 | Tano et al. |
| 2007/0102696 | A1 | 5/2007 | Brown et al. |
| 2007/0190673 | A1 | 8/2007 | Ko et al. |
| 2008/0193877 | A1 | 8/2008 | Kim et al. |
| 2008/0194740 | A1 | 8/2008 | Elce et al. |
| 2008/0237583 | A1 | 10/2008 | Masuda |
| 2009/0042346 | A1 | 2/2009 | Kugler |
| 2009/0057656 | A1 | 3/2009 | Matsubara et al. |
| 2009/0098680 | A1 | 4/2009 | Tsai et al. |
| 2010/0090204 | A1 | 4/2010 | Chuman et al. |
| 2010/0108999 | A1 | 5/2010 | Mueller et al. |
| 2011/0018061 | A1 | 1/2011 | Noh et al. |
| 2011/0101317 | A1 | 5/2011 | Gregory et al. |
| 2011/0180907 | A1 | 7/2011 | McConnell |
| 2012/0056183 | A1 * | 3/2012 | Mueller .............. C08F 232/00 257/57 |
| 2012/0056249 | A1 | 3/2012 | Mueller et al. |

FOREIGN PATENT DOCUMENTS

| | | |
|---|---|---|
| GB | 2458454 A | 9/2009 |
| GB | 2462845 A | 2/2010 |
| WO | WO-03/052841 A1 | 6/2003 |
| WO | WO-03/079458 A1 | 9/2003 |
| WO | WO-2005055248 A2 | 6/2005 |
| WO | WO-2005076076 A2 | 8/2005 |
| WO | WO-2005081306 A1 | 9/2005 |
| WO | WO-2007023272 A1 | 3/2007 |
| WO | WO-2008/070774 A1 | 6/2008 |
| WO | WO-2008117395 A1 | 10/2008 |
| WO | WO-2009077738 A1 | 6/2009 |
| WO | WO-2009080799 A2 | 7/2009 |
| WO | WO-2009/112569 A1 | 9/2009 |
| WO | WO-2010/020790 A1 | 2/2010 |
| WO | WO-PCT/EP2011/004281 | 8/2011 |
| WO | WO-PCT/EP2011/004282 | 8/2011 |
| WO | WO-2012028278 A1 | 3/2012 |
| WO | WO-2012028279 A1 | 3/2012 |

OTHER PUBLICATIONS

Kho, S., et al., "Passivation of Organic Light-Emitting Diodes by the Plasma Polymerized para-Xylene Thin Film", Japanese Journal of Applied Physics, vol. 41, (2002), pp. L1336-L1338.

Schwabegger, G., et al., "High mobility, low voltage operating $C_{60}$ based n-type organic field effect transistors", Synthetic Metals, vol. 161, (2011), pp. 2058-2062.

Tsukagoshi, K., et al., "Pentacene transistor encapsulated by poly-*para*-xylylene behaving as gate dielectric insulator and passivation film", Applied Physics Letters, vol. 87, (2005), pp. 183502-1-183502-3.

Grove, N.R. et al., "Functionalized Polynorbornene Dieelectric Polymers: Adhesion and Mechanical Properties", Journal of Polymer Science Part B: Polymer Physics, vol. 37, (1999), pp. 3003-3010.

Eiroma, K., et al., "UV Curing for Printed Electronics", Radtech Report, Technical Paper, Sep./Oct. 2007, pp. 31-34.

\* cited by examiner

POLYCYCLOOLEFINIC POLYMER FORMULATION FOR AN ORGANIC SEMICONDUCTOR

CROSS-REFERENCE TO RELATED APPLICATIONS

This application is a national stage application (under 35 U.S.C. §371) of PCT/EP2013/002671, filed Sep. 5, 2013, which claims benefit of U.S. Application No. 61/704,112, filed Sep. 21, 2012, both application of which are incorporated herein by reference in their entirety.

TECHNICAL FIELD

Embodiments in accordance with the present invention relate generally to formulations for use in organic semiconductor layers of organic electronic devices, and more specifically in organic field effect transistors, to organic semiconductor layers prepared from such formulations, and to organic electronic devices and organic field effect transistors encompassing such organic semiconductor layers.

BACKGROUND

In recent years there has been growing interest in organic electronic (OE) devices, for example organic field effect transistors (OFET) for use in backplanes of display devices or logic capable circuits, and organic photovoltaic (OPV) devices. A conventional OFET has a gate electrode, a gate insulator layer made of a dielectric material (also referred to as "dielectric" or "gate dielectric"), source and drain electrodes, a semiconducting layer made of an organic semiconductor (OSC) material, and typically a passivation layer on top of the aforementioned layers to provide protection against environmental influence or against damage from subsequent device manufacturing steps.

For OE devices solution processable OSC layers are especially desired. The OSC materials should be solution based and should be suitable for solution based deposition methods such as spin-coating, slot-die coating and doctor blade coating, or wider area printing methods such as flexo, gravure, and screen printing. Key requirements for OSC materials used in such solution processed layers are orthogonality of the OSC solvent towards the underlying device layer, and good adhesion of the OSC to the device layers provided above and below the OSC layer, such as gate dielectric or passivation layers.

Parylene (poly(p-xylylene)) is a dielectric material that is commonly used in dielectric or passivation layers of OE devices such as OFETs. Parylene is a commercially available dielectric which polymerizes when being deposited on a substrate from a vaporized p-xylylene monomer. The advantage of Parylene is its relatively simple processing, resulting in a highly pure and homogeneous thin film, which is an excellent chemical barrier, both thermally stable and UV stable.

However, the adhesion of Parylene to the commonly used solution processable OSC compositions is often very low.

Thus it would be desirable to provide solution processable OSC formulations for the preparation of OSC layers in OE devices, which show improved adhesion to a Parylene layer as used in dielectric or passivation layers of such devices.

SUMMARY

Embodiments in accordance with the present invention encompass-formulations encompassing an organic semiconductor (OSC) and a polycycloolefinic polymer having one or more reactive pendant groups, said formulations optionally encompassing a solvent.

Some embodiments in accordance with the present invention encompass OSC layers obtained through the use of the aforementioned formulation.

Some embodiments in accordance with the present invention encompass a process of preparing an OSC layer from the aforementioned formulation.

Some embodiments in accordance with the present invention encompass an organic electronic (OE) device encompassing an OSC layer being obtained through the use of a formulation encompassing a solvent, an OSC and a polycycloolefinic polymer having one or more pendant reactive groups, said OE device further encompassing a dielectric or passivation layer that is obtained by vapor deposition of a p-xylylene onto said OSC layer.

Some embodiments in accordance with the present invention are also directed to a process of preparing OE devices, encompassing providing an OSC layer through the use of the aforementioned OSC formulation, and providing a dielectric or passivation layer obtained by vapor deposition of a p-xylylene onto said OSC layer.

The aforementioned OE devices are, for example, Organic Field Effect Transistors (OFET), including Organic Thin Film Transistors (OTFT), Organic Light Emitting Diodes (OLED), Organic Photodetectors (OPD) or Organic Photovoltaic (OPV) devices. With regard to OFETs such devices are inclusive of both top gate and bottom gate OFETs.

Embodiments of the present invention are also inclusive of products or assemblies encompassing an OE device as described above and below. Such products or assemblies being integrated Circuits (IC), Radio Frequency Identification (RFID) tags, security markings or security devices containing an RFID tag, Flat Panel Displays (FPD), backplanes of FPDs, backlights of FPDs, electrophotographic devices, electrophotographic recording devices, organic memory devices, pressure sensors, optical sensors, chemical sensors, biosensors or biochips.

BRIEF DESCRIPTION OF THE DRAWINGS

Embodiments of the invention are described below with reference to the following drawings.

DETAILED DESCRIPTION

Figure 1:
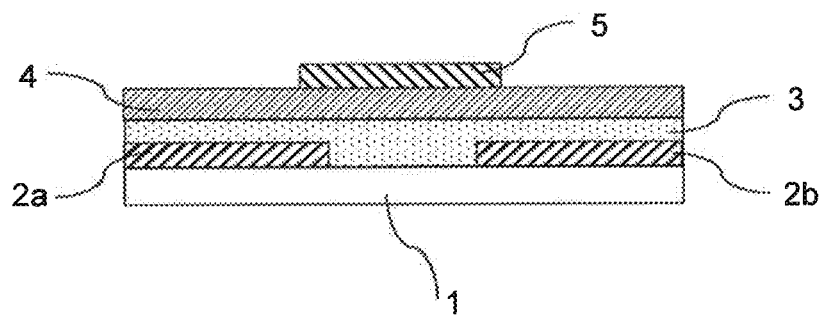
FIG. 1 is a schematic representation of a top gate OFET device embodiment in accordance with the present invention.

As used herein, the term Organic Field Effect Transistors (OFET) will be understood to be inclusive of the subclass of such devices known as Organic Thin Film Transistors (OTFTs).

In addition, it will be understood that the terms "dielectric" and "insulating" are used interchangeably herein. Thus reference to an insulating material or layer is inclusive of a dielectric material or layer. Further, as used herein, the term "organic electronic device" will be understood to be inclusive of the term "organic semiconductor device" and the several specific implementations of such devices, such as the OFETs, are as defined above.

It will be understood that the terms "Parylene" and "poly (p-xylylene)" are used interchangeably herein. Thus reference to Parylene is inclusive of a poly(p-xylylene) and vice versa. Parylene is the generic name for a series of chemical vapor deposited poly(p-xylylenes). Parylene is usually prepared by chemical vapor deposition of a p-xylylene intermediate of the following structure

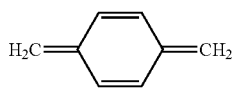

which is optionally substituted as described hereinafter. The p-xylylene intermediate can be derived from [2.2]paracyclophane of the following structure

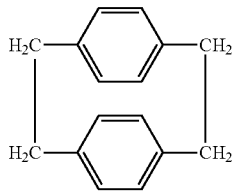 [SMILES: c1cc2ccc1CCc1ccc(cc1)CC2]

The phenylene rings and/or the methylene groups of the p-xylylene can also be substituted. The polymers can also encompass two or more distinct types of unsubstituted and/or substituted p-xylylene repeating units. For example, Parylene N denotes unsubstituted poly(p-xylylene) of the following structure

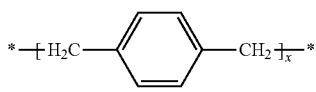

while Parylene C and Parlyene D denote mono- or dichlorinated poly(p-xylylene) of the following structure, respectively

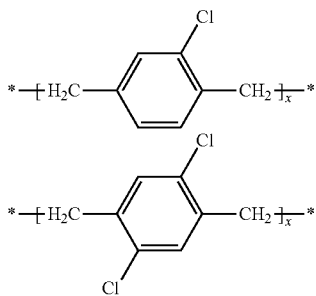

Other Parylene types include for example those wherein the phenylene or methylene groups are fluorinated, like Parylene AF-4, Parylene SF, or Parylene HT, all of which encompass difluorinated methylene groups, or Parylene VT which encompasses a fluorinated phenylene group. Further Parylene types include reactive co-polymers comprising unsubstituted p-xylylene units (as in Parylene N), and p-xylylene units wherein the phenylene ring is substituted by a reactive group, for example by an amine group (Parylene A), a methylamine group (Parylene AM), or an ethynyl group (Parylene X).

Unless stated otherwise, the terms "Parylene" and "poly (p-xylylene)" as used hereinafter will be understood to include both unsubstituted and substituted Parylene types, including but not limited to Parylene N, C, D, AF-4, SF, HT, VT, A, AM, and X, for example.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, small amounts of residues from initiators, catalysts and other elements attendant to the synthesis of such a polymer, where such residues are understood as not being covalently incorporated thereto. Further, while such residues, and other elements, are generally removed during post polymerization purification processes, trace amounts of such materials can be found to be mixed or co-mingled with the polymer such that they generally remain with the polymer when it is transferred between vessels or between solvents or dispersion media.

As used herein, the term "small molecule" will be understood to mean a monomeric compound which typically does not carry a reactive group by which it can be reacted to form a polymer, and which is designated to be used in monomeric form. In contrast thereto, the term "monomer", unless stated otherwise, will be understood to mean a monomeric compound that carries one or more reactive functional groups by which it can be reacted to form an oligomer or a polymer.

As used herein, the term "organic semiconductor (OSC) formulation", also shortly referred to as "formulation", means at least one organic semiconductor (OSC) compound and one or more other materials added to the at least one OSC compound to provide, or to modify, specific properties of the OSC formulation and/or of the at least one OSC compound therein. It will be understood that an OSC formulation is also a vehicle for carrying the OSC to a substrate to enable the forming of layers or structures thereon. Exemplary materials include, but are not limited to, solvents, volatile surfactants and adhesion promoters.

As defined herein, the terms "polycycloolefin", "polycyclic olefin", and "norbornene-type" are used interchangeably and refer to addition polymerizable monomers, or the resulting repeating unit, encompassing at least one norbornene moiety such as shown by either Structure A1 or A2, below. The simplest norbornene-type or polycyclic olefin monomer bicyclo[2.2.1]hept-2-ene (A1) is commonly referred to as norbornene.

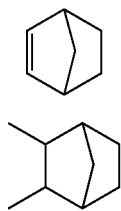

(A1)

(A2)

However, the term "norbornene-type repeating unit" or "norbornene-type monomer", as used herein, is understood to not only mean norbornene itself but also to refer to any substituted norbornene, or substituted and unsubstituted higher cyclic derivatives thereof, for example of Structures B1 or B2, respectively shown below, wherein m is an integer of zero or greater.

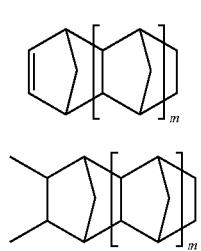

(B1)

(B2)

As will be discussed hereinafter, the use of a substituted norbornene-type monomer to form polymer embodiments of the present invention allows for the properties of such embodiments to be tailored to fulfill the needs of individual applications. The procedures and methods that have been developed to polymerize norbornene-type monomers having a variety of functional substituents, such as those described below, exhibit an outstanding flexibility and tolerance to various moieties and groups of the monomers. In addition to polymerization of monomers with a specific pendent group, monomers having a variety of distinct functionalities can be randomly polymerized to form a final material where the types and ratios of monomers used dictate the overall bulk properties of the resulting polymer.

As used herein, "hydrocarbyl" refers to a radical or group that contains a carbon backbone where each carbon is appropriately substituted with one or more hydrogen atoms. The term "halohydrocarbyl" refers to a hydrocarbyl group where one or more of the hydrogen atoms, but not all, have been replaced by a halogen (F, Cl, Br, or I). The term perhalocarbyl refers to a hydrocarbyl group where each hydrogen has been replaced by a halogen. Non-limiting examples of hydrocarbyls, include, but are not limited to a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. Representative alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. Representative alkenyl groups include but are not limited to vinyl, propenyl, butenyl and hexenyl. Representative alkynyl groups include but are not limited to ethynyl, 1-propynyl, 2-propynyl, 1 butynyl, and 2-butynyl. Representative cycloalkyl groups include but are not limited to cyclopentyl, cyclohexyl, and cyclooctyl substituents. Representative aryl groups include but are not limited to phenyl, biphenyl, naphthyl, and anthracenyl. Representative aralkyl groups include but are not limited to benzyl, phenethyl and phenbutyl.

The term "halohydrocarbyl" as used herein is inclusive of the hydrocarbyl moieties mentioned above but where there is a degree of halogenation that can range from at least one hydrogen atom being replaced by a halogen atom (e.g., a fluoromethyl group) to where all hydrogen atoms on the hydrocarbyl group have been replaced by a halogen atom (e.g., trifluoromethyl or perfluoromethyl), also referred to as perhalogenation. For example, halogenated alkyl groups that can be useful in embodiments of the present invention can be partially or fully halogenated, alkyl groups of the formula $C_eX_{2e+1}$ wherein X is independently a halogen or a hydrogen and e is selected from an integer of 1 to 25. In some embodiments each X is independently selected from hydrogen, chlorine, fluorine bromine and/or iodine. In other embodiments each X is independently either hydrogen or fluorine. Thus, representative halohydrocarbyls and perhalocarbyls are exemplified by the aforementioned exemplary hydrocarbyls where an appropriate number of hydrogen atoms are each replaced with a halogen atom.

In addition, the definition of the terms "hydrocarbyl", "halohydrocarbyl", and "perhalohydrocarbyl", are inclusive of moieties where one or more of the carbons atoms is replaced by a heteroatom selected independently from O, N, P, or Si. Such heteroatom containing moieties can be referred to as, for example, either "heteroatom-hydrocarbyls" or "heterohydrocarbyls", including, among others, ethers, epoxies, glycidyl ethers, alcohols, carboxylic acids, esters, maleimides, amines, imines, amides, phenols, amido-phenols, silanes, siloxanes, phosphines, phosphine oxides, phosphinites, phosphonites, phosphites, phosphonates, phosphinates, and phosphates.

Further exemplary hydrocarbyls, halohydrocarbyls, and perhalocarbyls, inclusive of heteroatoms, include, but are not limited to, $-(CH_2)_n-Ar-(CH_2)_n-C(CF_3)_2-OH$, $-(CH_2)_n-Ar-(CH_2)_n-OCH_2C(CF_3)_2-OH$, $-(CH_2)_n-C(CF_3)_2-OH$, $-((CH_2)_i-O-)_k-(CH_2)-C(CF_3)_2-OH$, $-(CH_2)_n-C(CF_3)(CH_3)-OH$, $-(CH_2)_n-C(O)NHR^*$, $-(CH_2)_n-C(O)Cl$, $-(CH_2)_n-C(O)OR^*$, $-(CH_2)_n-OR^*$, $-(CH_2)_n-OC(O)R^*$ and $-(CH_2)_n-C(O)R^*$, where n independently represents an integer from 0 to 12, i is 2, 3 or 4, k is 1, 2 or 3, Ar is aryl, for example phenyl, and $R^*$ independently represents hydrogen, a $C_1$-$C_{11}$ alkyl, a $C_1$-$C_{11}$ halogenated or perhalogenated alkyl, a $C_2$-$C_{10}$ alkenyl, a $C_2$-$C_{10}$ alkynyl, a $C_5$-$C_{12}$ cycloalkyl, a $C_6$-$C_{14}$ aryl, a $C_6$-$C_{14}$ halogenated or perhalogenated aryl, a $C_7$-$C_{14}$ aralkyl or a halogenated or perhalogenated $C_7$-$C_{14}$ aralkyl.

Exemplary perhalogenated alkyl groups include, but are not limited to, trifluoromethyl, trichloromethyl, $-C_2F_5$, $-C_3F_7$, $C_4F_9$, $C_6F_{13}$, $-C_7F_{15}$, and $-C_{11}F_{23}$. Exemplary halogenated or perhalogenated aryl and aralkyl groups include, but are not limited to, groups having the formula $-(CH_2)_o-C_6F_pH_{5-o}$, and $-(CH_2)_o-C_6F_pH_{4-p}$-$pC_qF_rH_{2q+1-r}$, where o, p, r and q are independently selected integers from 0 to 5, 0 to 5, 0 to 9 and 1 to 4, respectively. Specifically, such exemplary halogenated or perhalogenated aryl groups include, but are not limited to, pentachlorophenyl, pentafluorophenyl, pentafluorobenzyl, 4-trifluoromethylbenzyl, pentafluorophenethyl, pentafluorophenpropyl, and pentafluorophenbutyl.

Some preferred embodiments of the present invention encompass an OSC formulation encompassing an OSC and a polymeric additive, werein said OSC formulation can he used for preparing an OSC layer in an OE device. The OSC formulation is especially suitable for use in an OE device where a dielectric or passivation layer is provided on top of the OSC layer, said dielectric or passivation layer encompassing a poly(p-xylylene), also know as Parylene, which is formed by vapor deposition of a p-xylylene. The polymeric additive encompasses a polycycloolefinic polymer having one or more pendant reactive groups, and can serve as adhesion promoter to improve the adhesion of the OSC layer to the Parylene layer, without negatively affecting the performance of the OSC layer.

Without wishing to be bound to a specific theory, it is believed that one or more of the reactive groups of the polymeric additive, which is encompassed in the OSC layer, will react with unsaturated groups of the p-xyxlylene, which is used for forming the dielectric or passivation layer, at the interface between the OSC layer and the dielectric or passivation layer during vapor deposition of the p-xylylene. It is further believed that this results in chemical bonding between the polymeric additive of the OSC layer and the poly(p-xylylene) of the dielectric or passivation layer at the interface between these two layers, thus increasing the adhesion between the two layers.

In addition to acting as as adhesion promoter, the polymeric additive can also serve as binder for the OSC. The polymeric additive can thus replace conventional polymeric binders, such as polystyrene, poly(4-methylstyrene), poly(α-methylstyrene), poly(4-vinylbiphenyl), or poly(triarylamine) for example, which are commonly used in combination with small molecule OSCs to improve their processability and the structural integrity of the OSC layer in the device.

The polycycloolefinic polymer which is used as polymeric additive in the OSC formulations of the present invention is for example selected from norbornene-type polymers.

In some preferred polymer embodiments in accordance with the invention, the norbornene-type polymers incorporate two or more distinct types of repeating units.

Other preferred polymer embodiments in accordance with the invention encompass one or more norbornene-type polymers having one or more distinct types of repeating units of Formula I

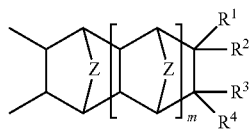

wherein Z is selected from —$CH_2$—, —$CH_2$—$CH_2$— or —O—, m is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group, and wherein in at least one repeating unit one or more of $R^{1-4}$ denote or encompass a reactive group.

The repeating units of Formula I are formed from the corresponding norbornene-type monomers of Formula Ia where Z, m and $R^{1-4}$ are as defined above:

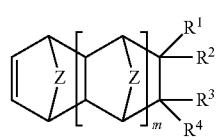

For some preferred polymer embodiments in accordance with the present invention, for the repeating units and monomers of Formula I and Ia, Z is —$CH_2$— and m is 0, 1 or 2. For other such embodiments Z is —$CH_2$— and m is 0 or 1, and for still other embodiments Z is —$CH_2$— and m is 0.

Other preferred polymer embodiments of the present invention encompass polymers of Formula I that encompass repeating units where one or more of $R^{1-4}$ are different from H, more specifically only one of $R^{1-4}$, for example $R^1$, is different from H, and the others of $R^{1-4}$ are H.

Polymer embodiments in accordance with the invention encompass either a single norbornene-type polymer or a blend of two or more different norbornene-type polymers. Where such polymer embodiments encompass a single norbornene-type polymer, such polymer can be a homopolymer, that is to say a polymer encompassing only one type of repeating unit, or a copolymer, that is to say a polymer encompassing two or more distinct types of repeating units. Where such polymer embodiments encompass a blend of different polymers, "different" is understood to mean that each of the blended polymers encompasses at least one type of repeating unit, or combination of repeating units, that is distinct from any of the other blended polymers.

Other preferred polymer embodiments in accordance with the invention encompass a blend of two or more different norbornene-type polymers, wherein each polymer encompasses one or more distinct types of repeating units of formula I

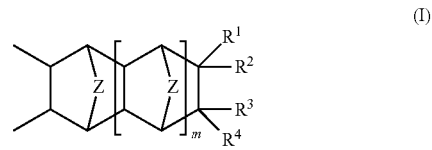

wherein Z is selected from —$CH_2$—, —$CH_2$—$CH_2$— or —O—, in is an integer from 0 to 5, each of $R^1$, $R^2$, $R^3$ and $R^4$ are independently selected from H, a $C_1$ to $C_{25}$ hydrocarbyl, a $C_1$ to $C_{25}$ halohydrocarbyl or a $C_1$ to $C_{25}$ perhalocarbyl group, and wherein in at least one repeating unit of at least one polymer one or more of $R^{1-4}$ denote or encompass a reactive group.

The polymer embodiments of the present invention can advantageously be tailored to provide a distinct set of properties for each of many specific applications. That is to say that different combinations of norbornene-type monomers with several different types of pendant groups can be polymerized to provide norbornene-type polymers having properties that provide for obtaining control over properties such as flexibility, adhesion, dielectric constant, and solubility in organic solvents, among others. For example, varying the length of an alkyl pendant group can allow control of the polymer's modulus and glass transition temperature ($T_g$). Also, pendant groups selected from maleimide, cinnamate, coumarin, anhydride, alcohol, ester, and epoxy functional groups can be used to promote crosslinking and to modify solubility characteristics. Polar functional groups, epoxy and triethoxysilyl groups can be used to provide adhesion to metals, silicon, and oxides in adjacent device layers. Fluorinated groups, for example, can be used to effectively modify surface energy, dielectric constant and influence the orthogonality of the solution with respect to other materials.

In some preferred polymer embodiments in accordance with the invention, the norbornene-type polymers incorporate one or more distinct types of repeating units, where at least one such type of repeating unit encompasses one or more pendant reactive groups. Preferred reactive groups include a group encompassing a hydroxyl portion or group encompassing an olefinic portion.

In other preferred polymer embodiments in accordance with the invention, in particular for such embodiments where one or more of $R^{1-4}$ are different from H, more specifically where only one of $R^{1-4}$ is different from H, one or more of $R^{1-4}$ denote a group that is a reactive group. Preferred reactive groups of this type encompass a linking portion L and a functional portion F. Preferably L denotes or encompasses a group selected from $C_1$-$C_{12}$ alkyls, aralkyls, aryls or hetero atom analogs. Further preferably F denotes or encompasses one or more of a hydroxyl moiety or a vinyl moiety.

As used herein, the term "reactive", when used to describe certain pendant groups, will be understood to mean a group that is capable of entering into a polymerization or crosslinking reaction with the p-xylylene of the dielectric or passivation layer.

Preferred exemplary repeating units that encompass a pendant reactive group with an olefinic portion, and that are representative of Formula I, are formed during polymerization from norbornene-type monomers that include, but are not limited to, those selected from formula M1

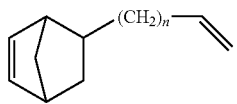

where n is an integer from 0 to 8. An example of a norbornene-type monomer of formula M1 is the monomer of subformula M1a ("hexenylNB").

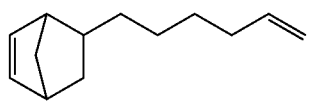

During polymerization of the norbornene-type monomers, at least a part of the olefinic portion can undergo isomerization, as a result of which the C=C double bond may be shifted from a terminal position to a non-terminal position in the olefinic chain. Thus, the norbornene-type polymer can encompass both repeating units with an isomerized olefinic group and repeating units with a non-isomerized olefinic group.

Preferred exemplary repeating units that encompass a pendant reactive group with an olefinic portion, and that are representative of Formula I, are those of formula P1 (before or after isomerization) and formula P2 (after isomerization).

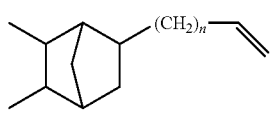

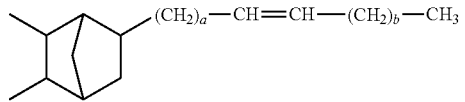

where n is an integer from 0 to 8, a and b are independently of each other an integer from 0 to 7, and wherein a+b≤7.

Preferred examples of norbornene-type repeating units of formulae P1 and P2 are selected of the following subformulae

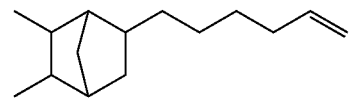

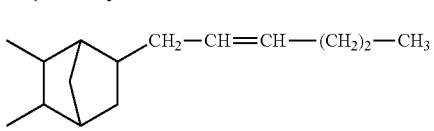

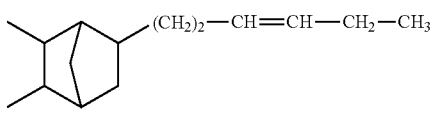

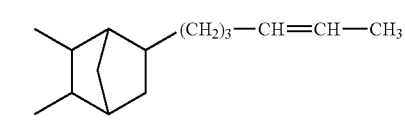

The norbornene-type polymer can encompass both repeating units of formula P1 or its subformulae, and repeating units of formula P2 or its subformulae.

Preferred exemplary repeating units that encompass a pendant reactive group with a hydroxyl portion, and that are representative of Formula I, are those selected from the following formulae

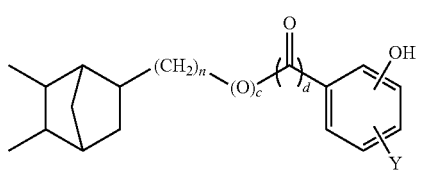

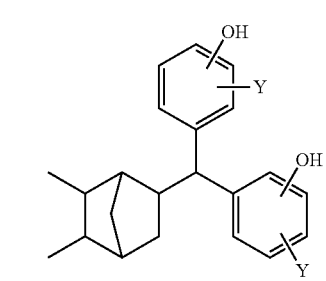

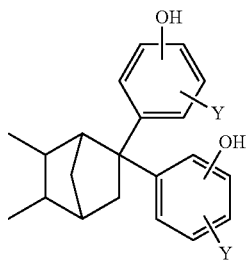

where Y is alkyl or alkoxy with 1 to 20 C atoms or alkylcarbonyl with 2 to 20 C atoms, n is an integer from 0 to 8, and c and d are independently of each other 0 or 1.

Preferred examples of norbornene-type repeating units of formulae P3-P5 are the repeating units of the following sub-formulae

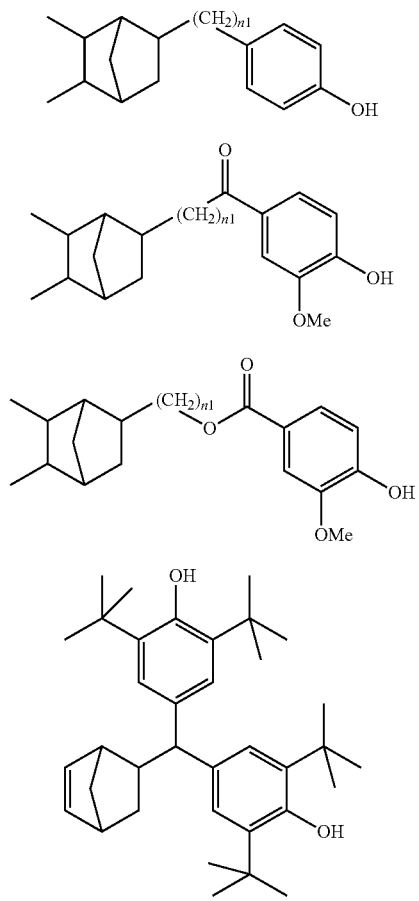

wherein n1 is 0, 1, 3, 4 or 5.

In other preferred polymer embodiments in accordance with the present invention, especially where the polymers encompass repeating units of Formula I where one or more of $R^{1-4}$ are different from H, or where only one of $R^{1-4}$ is different from H, one or more of $R^{1-4}$ denote a hydrocarbyl group. In these polymer embodiments one or more of $R^{1-4}$ denote for example a hydrocarbyl group which is a $C_1$-$C_{25}$ alkyl, a $C_2$-$C_{24}$ alkenyl, a $C_2$-$C_{24}$ alkynyl, a $C_5$-$C_{25}$ cycloalkyl, a $C_6$-$C_{24}$ aryl or a $C_7$-$C_{24}$ aralkyl. In other polymer embodiments the alkyl groups include but are not limited to methyl, ethyl, propyl, isopropyl, butyl, isobutyl, sec-butyl, tert-butyl, pentyl, neopentyl, hexyl, heptyl, octyl, nonyl, decyl and dodecyl. In still other polymer embodiments the alkenyl groups include but are not limited to vinyl, propenyl, butenyl and hexenyl. In still other polymer embodiments the alkynyl groups include but are not limited to ethynyl, 1-propynyl, 2-propynyl, 1 butynyl, and 2-butynyl. In still other polymer embodiments the cycloalkyl groups include but are not limited to cyclopentyl, cyclohexyl, and cyclooctyl substituents. In still other polymer embodiments the aryl groups include but are not limited to phenyl, biphenyl, naphthyl, and anthracenyl. In still other polymer embodiments the aralkyl groups include but are not limited to benzyl, phenethyl and phenbutyl.

Preferred exemplary repeating units that are representative of Formula I and encompass a hydrocarbyl group include, but are not limited to, those selected from the following formulae:

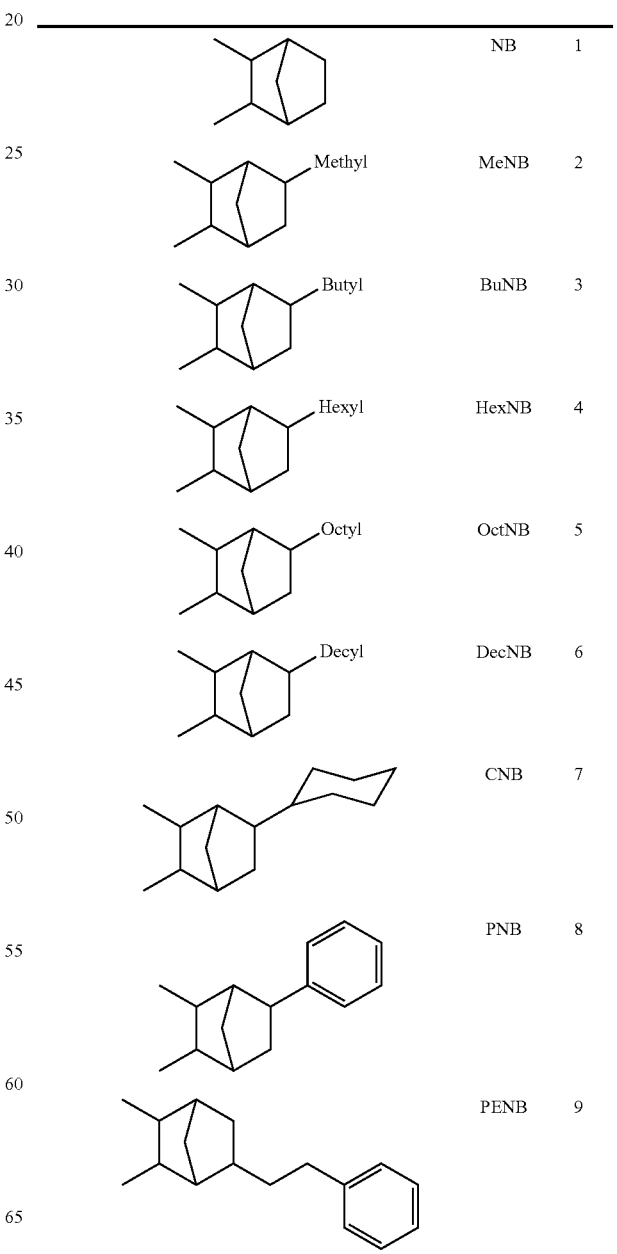

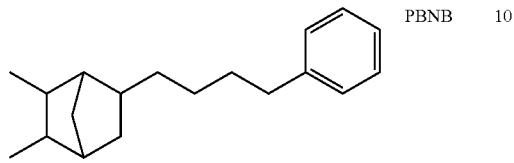

PBNB 10

Other preferred polymer embodiments in accordance with the present invention encompass polymers that encompass one or more first, distinct types of repeating units of Formula I wherein one or more of $R^{1-4}$ are different from H, more specifically only one of $R^{1-4}$ is different from H, and denote a reactive group, and one or more second, distinct types of repeating units of Formula I wherein one or more of $R^{1-4}$ are different from H, more specifically only one of $R^{1-4}$ is different from H, and denote a hydrocarbyl group. Polymers of this embodiment include those having a first type of repeating unit selected from the above subformulae P1, P1a, P2, P2a, P2b, P2c, P2d, P3, P3a, P3b, P3c, P4, P4a and P5, and a second type of repeating units selected from one of the above subformulae 1-10 (NB, MeNB, BuNB, HexNB, OctNB, DecNB, CNB, PNB, PENB, PBNB, respectively).

In some preferred polymer embodiments that encompass polymers having a first and a second distinct type of repeat units in accordance with Formula I, the ratio of such first and second type of repeat units is from 95:5 to 5:95. In other preferred embodiments the ratio of such first and second type of repeat units is from 80:20 to 20:80. In still other preferred embodiments the ratio of such first and second type of repeat units is from 60:40 to 40:60. In still other preferred embodiments the ratio of such first and second type of repeat units is from 55:45 to 45:55.

While Formula I and Ia, as well as each of the subformulae and generic formulae provided above are depicted without indication of any stereochemistry, it should be noted that generally each of the monomers, unless indicated otherwise, are obtained as diastereomeric mixtures that retain their configuration when converted into repeating units. As the exo- and endo-isomers of such diastereomeric mixtures can have slightly different properties, it should be further understood that preferred embodiments of the present invention are made to take advantage of such differences by using monomers that are either a mixture of isomers that is rich in either the exo- or endo-isomer, or are essentially the pure advantageous isomer.

Examples of suitable norbornene monomers, polymers and methods for their synthesis are provided herein and can also be found in U.S. Pat. No. 6,455,650, US 2011/0104614 A1, US 2007/0066775 A1, US 2008/0194740 A1, US 2012/0056249 A1 and US 2012/0056183 A1, which are incorporated into this application by reference. For example, exemplary polymerizations processes employing Group VIII transition metal catalysts are described in the aforementioned US 2006/0020068 A1.

The polymer embodiments of the present invention are formed having a weight average molecular weight ($M_w$) that is appropriate to their use. Generally, a $M_w$ from 5,000 to 500,000 is found appropriate for some embodiments, while for other embodiments other $M_w$ ranges can be advantageous. For example, in some preferred embodiments, the polymer has a $M_w$ of at least 30,000, while in other preferred embodiments the polymer has a $M_w$ of at least 60,000. In other preferred embodiments, the upper limit of the polymer's $M_w$ is up to 400,000, while in other preferred embodiments the upper limit of the polymer's $M_w$ is up to 250,000. It will be understood that since an appropriate $M_w$ is a function of the desired physical properties in the cured polymer, films, layers or structures derived therefrom, it is a design choice and thus any $M_w$ within the ranges provided above is within the scope of the present invention.

Other preferred embodiments in accordance with the present invention relate to an OSC formulation encompassing, in addition to the OSC and the polycycloolefinic polymer, respectively, a casting or printing solvent.

In some preferred formulation embodiments in accordance with the present invention the solvent is selected from organic solvents. In other embodiments the solvent includes, without limitation, cyclohexylbenzene, mesitylene, indan, xylene, tetralin, diethylbenzene or combinations of the aforementioned.

In other preferred formulation embodiments in accordance with the present invention embodiments the concentration of the OSC in the formulation is from 0.5 to 5%.

In other preferred formulation embodiments in accordance with the present invention the concentration of the polycycloolefinic polymer in the formulation is 0.05 to 1%.

The aforementioned concentration values refer to the OSC formulation encompassing the solvent(s) and all solid components such as OSC and polycycloolefinic polymer.

In other preferred formulation embodiments in accordance with the present invention the proportion of polycycloolefinic polymer to OSC in the formulation is from 1:40 to 1:1.

In some preferred formulation embodiments in accordance with the present invention the OSC can be an n- or p-type OSC. Effective OSCs exhibit a FET mobility of greater than $1 \times 10^{-5}$ cm$^2$V$^{-1}$s$^{-1}$.

The OSC material employed for device embodiments in accordance with the present invention can be any conjugated molecule, for example an aromatic molecule containing two or more, more specifically at least three aromatic rings. In some preferred OSC embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material can be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings can be optionally substituted with fluoro, cyano, alkyl, alkoxy, polyalkoxy, thioalkyl, silyl, ethynylsilyl, optionally substituted secondary or tertiary alkylamine or arylamine, aryl or substituted aryl groups, wherein ethynylsilyl groups are represented by —C≡C—SiR'R"R''', and substituted secondary or tertiary alkylamine or arylamine are represented by —N(R')(R"), wherein R' and R" are each independently H, optionally fluorinated $C_{1-12}$ alkyl or optionally fluorinated $C_{6-10}$ aryl.

The aforementioned aromatic rings can be fused rings or linked with a conjugated linking group such as —C(T')=C(T")—, —C≡C—, —N(R'''')—, —N=N—, (R'''')=N—, —N=C(R'''')—, where T' and T" each independently represent H, Cl, F, —C≡N or lower alkyl groups such as $C_{1-4}$ alkyl groups and R'''' is as defined above.

In other preferred formulation embodiments in accordance with the present invention, OSC materials that can be used include compounds, oligomers and derivatives of compounds selected from the group consisting of condensed aromatic hydrocarbons such as, tetracene, chrysene, pentacene, pyrene, perylene, coronene, or soluble substituted and/or heterocylic derivatives of the aforementioned; oligomeric para substituted phenylenes such as p-quaterphenyl (p-4P), p-quinquephenyl (p-5P), p-sexiphenyl (p-6P) or soluble substituted derivatives of these; benzidine compounds; stilbene compounds; triazines; substituted metallo- or metal-free porphines, phthalocyanines, fluorophthalo-cyanines, naphthalocyanines or fluoronaphthalocyanines; $C_{60}$ and $C_{70}$ fullerenes; N,N'-dialkyl, substituted dialkyl, diaryl or substituted diaryl-1,4,5,8-naphthalene-tetracarboxylic diimide and fluoro derivatives; N,N'-dialkyl, substituted dialkyl, diaryl or substituted diaryl 3,4,9,10-perylenetetracarboxylic diimide; batho-phenanthroline; diphenoquinones; 1,3,4-oxadiazoles; 11,11,12,12-tetracyano-naptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

In other preferred formulation embodiments in accordance with the present invention, the OSC materials are substituted oligoacenes such as pentacene, tetracene or anthracene, or heterocyclic derivatives thereof, more specifically oligoacenes that are substituted with alkylsilylethynyl groups, such as bis(trialkylsilylethynyl)oligoacenes or bis(trialkylsilylethynyl)heteroacenes, for example optionally fluorinated bis(trialkylsilylethynyl)anthradithiophenes, as disclosed for example in U.S. Pat. No. 6,690,029, WO 2005/055248 A1 or U.S. Pat. No. 7,385,221.

Where appropriate and needed to adjust the rheological properties of the OSC formulation, as described for example in WO 2005/055248 A1, some embodiments of the present invention employ OSC formulations that include one or more organic binders in addition to the polycycloolefinic polymer. In other embodiments the OSC formulation does not include an organic binder in addition to the polycyloolefinic polymer.

Other preferred embodiments in accordance with the invention relate to an OSC layer that is obtained through the use of an OSC formulation in accordance with the present invention.

Other preferred embodiments in accordance with the present invention relate to a process of preparing an OSC layer, encompassing depositing a OSC formulation in accordance with the present invention onto a substrate and, in case the OSC formulation encompasses a solvent, removing the solvent.

In some preferred OSC layer embodiments in accordance with the present invention, deposition and/or forming of the OSC layer are performed using solution processing techniques. For example a formulation of the OSC and the polycycloolefinic polymer, typically a solution encompassing one or more organic solvents, can be deposited or formed using preferred techniques that include, but are not limited to, dip coating, slot-die coating spin coating, ink jet printing, letterpress printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an OSC material, a bank structure material and an organic dielectric material can each be deposited or formed by spin coating, flexographic printing, and inkjet printing techniques in an order appropriate to the device being formed.

In other preferred OSC layer embodiments in accordance with the present invention the concentration of the polycycloolefinic polymer in the OSC layer after deposition and solvent removal is from 2.5 to 25%, more specifically from 10 to 15%.

Other preferred embodiments in accordance with the present invention relate to an OE device encompassing an OSC layer and a dielectric or passivation layer, wherein the OSC layer is obtained through the use of an OSC formulation in accordance with the invention, and the dielectric or passivation layer is obtained by vapor deposition of a p-xylylene, thus forming a layer of poly(p-xylylene).

In some preferred OE device embodiments in accordance with the present invention the poly(p-xylylene) is Parylene C.

Suitable process conditions for the vapor deposition process of p-xylylene are known to the skilled person and are described in the literature, for example in P. Kramer et al., *Journal of Polymer Science: Polymer Chemistry Edition*, Vol. 22 (1984), pp. 475-491.

In some preferred OE device embodiments in accordance with the present invention the OE device encompasses an OSC layer and a dielectric or passivation layer, wherein the OSC layer is obtained through the use of an OSC formulation encompassing an OSC and a polycycloolefinic polymer having one or more reactive groups, and the dielectric or passivation layer is obtained by vapor deposition of a p-xylylene on the OSC layer, thus forming a layer of a poly(p-xylylene) on the OSC layer, and wherein the reactive groups of the polycycloolefinic polymer react with unsaturated groups of the p-xylylene at the interface between the OSC layer and the dielectric or passivation layer during vapor deposition of the p-xylylene, resulting in chemical bonding of the polycycloolefinic polymer of the OSC layer with the poly(p-xylylene) of the dielectric or passivation layer at the interface between the OSC layer and the dielectric or passivation layer.

Preferred OE device embodiments in accordance with the present invention include, without limitation, organic field effect transistors (OFETs), organic thin film transistors (OTFTs), which can be top gate or bottom gate transistors, Organic Light Emitting Diodes (OLED), Organic Photodetecting (OPD) Devices or Organic Photovoltaic (OPV) Devices.

Some preferred OE device embodiments in accordance with the present invention can be for example OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing.

In some preferred OE device embodiments the OE device is a top gate OFET encompassing a gate dielectric layer encompassing a poly(p-xylylene).

In other preferred OE device embodiments the OE device is a bottom gate OFET encompassing a passivation layer encompassing a poly(p-xylylene).

Other preferred embodiments in accordance with the present invention relate to a process of preparing an OE device encompassing a dielectric or passivation layer obtained by vapor deposition of a p-xylylene, said OE device further encompassing an OSC layer being obtained through the use of an OSC formulation in accordance with the invention.

Other preferred embodiments of the present invention relate to a process of preparing an OE device, encompassing:

a) depositing an OSC formulation as described above and below onto a substrate to form an OSC layer, b) in case the OSC formulation encompasses a solvent, removing the solvent, c) optionally annealing the OSC layer, d) depositing a layer of a p-xylylene on the OSC layer by vapor deposition.

Figure 2:
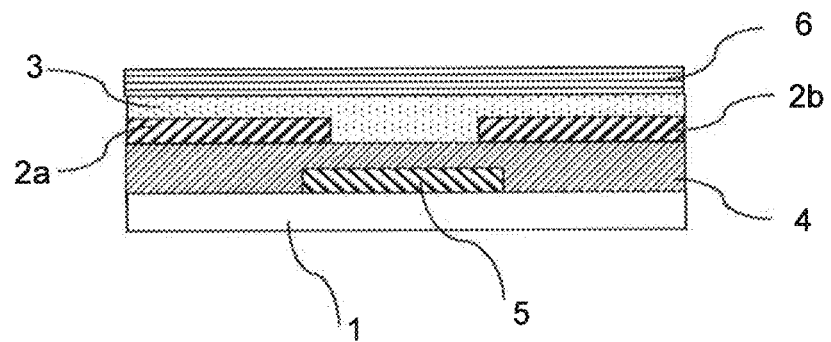
FIG. 2 is a schematic representation of a bottom gate OFET device embodiment in accordance with the present invention.

A top gate OFET in accordance with one preferred embodiment of the present invention is depicted schematically in FIG. 1, and a bottom gate OFET in accordance with another embodiment of the present invention is depicted schematically in FIG. 2.

Turning now to FIG. 1, a schematic and simplified representation of a top gate OFET device in accordance with an preferred embodiment of the present invention is provided. Such OFET device includes a substrate (1), source and drain electrodes (2a, 2b), an OSC layer (3) obtained through the use of a formulation as described above and below, a dielectric layer (4) encompassing a poly(p-xylylene) and serving as gate insulator, and a gate electrode (5).

Other preferred embodiments in accordance with the present invention relate to a process for preparing a top gate OFET device, for example as illustrated in FIG. 1, by a process encompassing:

a) forming source and drain electrodes (2a,2b) on a substrate (1), b) forming an OSC layer (3) from an OSC formulation as described above and below on the source and drain electrodes (2a,2b), c) forming a dielectric layer (4) by vapor deposition of a p-xylylene on the OSC layer (3), d) forming a gate electrode (5) on the dielectric layer (4).

Turning now to FIG. 2, a schematic and simplified representation of a bottom gate OFET device in accordance with another preferred embodiment of the present invention is provided. Such OFET device includes a substrate (1), a gate electrode (5), a dielectric layer (4) serving as gate insulator, source and drain electrodes (2a, 2b), an OSC layer (3) obtained through the use of a formulation as described above and below, and a passivation layer (6) encompassing a poly (p-xylylene).

Other preferred embodiments in accordance with the present invention relate to a process for preparing a bottom gate OFET device, for example as illustrated in FIG. 2, by a process encompassing:

a) forming a gate electrode (5) on a substrate (1), b) forming a dielectric layer (4) on the the substrate (1) and the gate electrode (5), c) forming source and drain electrodes (2a,2b) on the dielectric layer (4).

d) forming an OSC layer (3) from a formulation in accordance with the invention on the source and drain electrodes (2a,2b) and the dielectric layer (4), e) forming a passivation layer (6) by vapor deposition of a p-xylylene on the OSC layer (3).

In the aforementioned processes, the electrodes (2a, 2b, 5) are for example applied onto the substrate (1) or the dielectric layer (4) by a sputtering process, and can be patterned by etching and/or lithographic patterning. The OSC layer (3) and dielectric layer (4) can be applied by a coating or printing process as described above.

The other components or functional layers of the OE and OFET devices, like the substrate and the gate, source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

The gate, source and drain electrodes in the OFET device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3,4-ethylenedioxy-thiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors can also be used and deposited from a liquid phase.

Generally the thickness of a functional layer, for example a gate dielectric or OSC layer, in some preferred OE and OFET device embodiments in accordance with the present invention is from 0.001 (in case of a monolayer) to 10 µm; In other preferred embodiments such thickness ranges from 0.001 to 1 µm, and in still other preferred embodiments from 5 nm to 500 nm, although other thicknesses or ranges of thickness are contemplated and thus are within the scope of the present invention.

Various substrates may be used for the fabrication of the OE device embodiments of the present invention. For example glass or polymeric materials are most often used. Suitable and preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylene-vinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylinethacrylate, polypropylene, polystyrene, polysulphone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some preferred embodiments of the present invention the substrate can be any suitable material, for example plastic, metal or glass material coated with one or more of the above listed materials. It will be understood that in forming such a substrate, methods such as extruding, stretching, rubbing or photochemical techniques can be employed to provide a homogeneous surface for device fabrication as well as to provide pre-alignment of an organic semiconductor material in order to enhance carrier mobility therein.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, can be replaced by alternative features serving the same, equivalent or similar purpose. Thus, unless stated otherwise, each feature disclosed is one example only of a generic series of equivalent or similar features.

All of the features disclosed in this specification can be combined in any combination, except combinations where at least some of such features and/or steps are mutually exclusive. In particular, the features of the invention are applicable to all aspects of the invention and can be used in any combination. Likewise, features described in non-essential combinations can be used separately (not in combination.

The invention will now he described in more detail by reference to the following examples, which are illustrative only and do not limit the scope of the invention.

Above and below, unless stated otherwise percentages are per cent by weight and temperatures are given in degrees Celsius (° C.). The values of the dielectric constant ϵ ("permittivity") refer to values taken at 20° C. and 1,000 Hz.

Example 1

Polymer 1 (poly(phenethylnorbornene[94%]-co-hexenylnorbornene[6%])) was prepared as follows.

A solution of LiFABA ([Li(Et$_2$O)$_{2.5}$][B(C$_6$F$_5$)$_4$], 20 mg) and phenethylnorbornene (PENB, 27.6 g, 139 mmol) and hexenylnorbornene of formula M1a ("hexenylNB", 2.73 g, 16.0 mmol) in toluene (total solution volume 110 mL) was heated to 80° C. Then a solution of [(allyl)palladium (trinaphthylphosphine)(trifluoroacetate)] (5.5 mg) in 1 mL of toluene was added to the reaction mixture. The reaction mixture stirred for 16 h at 80° C. The reaction mixture was allowed to cool to room temperature. The reaction mixture was poured into acetone (~10 fold excess). The precipitated polymer was filtered, then dried in a vacuum oven at 50° C. overnight to give a white powder. Yield: 30.1 g (99%). GPC: $M_w$=98,000, $M_n$=17,000, $M_w/M_n$=5.84. The polymer was determined by $^1$H NMR methods to contain 94% PENB and 6% hexenylNB. The ratio of terminal to isomerized olefins associated with the hexenylNB pendent group was determined to be 1.5/1 by $^1$H NMR methods.

Example 2

Polymer 2 (poly(phenethylnorbornene[71%]-co-hexenylnorbornene[29%])) was prepared as follows.

A solution of LiFABA ([Li(Et$_2$O)$_{2.5}$][B(C$_6$F$_5$)$_4$], 21 mg) and phenethylnorbornene (PENB, 21.9 g, 111 mmol) and hexenylnorbornene of formula M1a ("hexenylNB", 8.34 g, 47.0 mmol) in toluene (total solution volume 109 mL) was heated to 80° C. Then a solution of [(allyl)palladium (trinaphthylphosphine)(trifluoroacetate)] (5.6 mg) in 1 mL of toluene was added to the reaction mixture. The reaction mixture stirred for 16 h at 80° C. The reaction mixture was allowed to cool to room temperature. The reaction mixture was poured into acetone (~10 fold excess). The precipitated polymer was filtered, then dried in a vacuum oven at 50° C. overnight to give a white powder. Yield: 29.9 g (99%). GPC: $M_w$=131,000, $M_n$=22,000, $M_w/M_n$=5.99. The polymer was determined by $^1$H NMR methods to contain 71% PENB and 29% hexenylNB. Isomerized olefins resonances associated with the hexenylNB pendent group were undetectable by $^1$H NMR methods.

Example 3

Polymer 3 (poly(phenylethylnorbornene[82%]-co-hexenylnorbornene[18%])) was prepared as follows.

A solution of LIFABA ([Li(Et$_2$O)$_{2.5}$][B(C$_6$F$_5$)$_4$], 20 mg) and phenethylnorbornene (PENB, 24.6 g, 124 mmol) and hexenylnorbornene of formula M1a ("hexenylNB", 5.46 g, 31.0 mmol) in toluene (total solution volume 108 mL) was heated to 80° C. Then a solution of [(allyl)palladium (trinaphthylphosphine)(trifluoroacetate)] (5.3 mg) in 1 mL of toluene was added to the reaction mixture. The reaction mixture stirred for 16 h at 80° C. The reaction mixture was allowed to cool to room temperature. The reaction mixture was poured into acetone (~10 fold excess). The precipitated polymer was filtered, then dried under in a vacuum oven at 50° C. overnight to give a white powder. Yield: 28.5 g (95%), GPC: $M_w$=108,000, $M_n$=13,000, $M_w/M_n$=8.29. The polymer was determined by $^1$H NMR methods to contain 82% PENB and 18% hexenylNB. The ratio of terminal to isomerized olefins associated with the hexenylNB pendent group was determined to be 2/1 by $^1$H NMR methods

Example 4

Polymer 4 (poly(phenylnorbornene[78%]-co-hexenylnorbornene[22%])) was prepared as follows.

A solution of LiFABA ([Li(Et2O)2.5][B(C6F5)4], 92 mg) and phenylnorbornene (PNB, 23.8 g, 140 mmol) and hexenylnorbornene of formula M1a ("hexenylNB", 6.18 g, 35.1 mmol) in toluene (total solution volume 110 mL) was heated to 80° C. Then a solution of [(allyl)palladium (trinaphthylphosphine)(trifluoroacetate)] (25 mg) in 1 mL of toluene was added to the reaction mixture. The reaction mixture stirred for 16 h at 80° C. The reaction mixture was allowed to cool to room temperature. The reaction mixture was poured into acetone (~10 fold excess). The precipitated polymer was filtered, then dried in a vacuum oven at 50° C. overnight to give a white powder. Yield: 28.3 g (94%). GPC: Mw=65,000, Mn=10,000, Mw/Mn=6.24. The polymer was determined by 1H NMR methods to contain 78% PNB and 22% hexenylNB. Isomerized olefins resonances associated with the hexenylNB pendent group were undetectable by 1H NMR methods.

Example 5-7

Polymers 5-7 (poly(phenethylnorbornene-co-hexenylnorbornene) with varying ratios of the two monomers as shown in Table 1, were prepared as follows.

A solution of LiFABA ([Li(Et$_2$O)$_{2.5}$][B(C$_6$F$_5$)$_4$], see Table 1) and phenethylnorbornene (PENB, 24.6 g, 124 mmol) and hexenylnorbornene of formula M1a ("hexenylNB", 5.46 g, 31.0 mmol) and 1-hexene (see Table 1) in toluene (total solution volume see Table 1) was heated to 80° C. Then a solution of [(allyl)palladium(trinaphthylphosphine)(trifluoroacetate)] (see Table 1) in toluene was added to the reaction mixture. The reaction mixture stirred for desired time (see table) at 80° C. The reaction mixture was allowed to cool to room temperature. The reaction mixture was diluted to 200 mL total volume with THF and was poured into acetone (~10 fold excess). The precipitated polymer was filtered, then dried in a vacuum oven at 50° C. overnight to give a white powder. Yield: see Table 1. GPC: see Table 21. The polymer composition was determined by $^1$H NMRT methods (see Table 1). The ratio of terminal to isomerized olefins associated with the hexenylNB pendent group was determined by $^1$H NMR methods (see Table 1).

TABLE 1

| Polymer No. | Notebook Number Semi-3 13- | Pd | LiFABA | 1-Hexene | Total Solution Volume | time (h) | yield |
|---|---|---|---|---|---|---|---|
| 5 | 11A | 11 mg, 0.016 mmol, 0.01M | 41 mg, 0.047 mmol, 0.05M | 3.67 g, 34 mmol | 108 mL | 16 | 26.5 g, 88% |
| 6 | 13 | 5 mg, 0.008 mmol, 0.01M | 20 mg, 0.023 mmol, 0.02M | 4.82 g, 42 mmol | 108 mL | 16 | 22.4 g, 75% |
| 7 | 18 | 7 mg, 0.010 mmol, 0.01M | 36 mg, 0.041 mmol, 0.04M | 4.83 g, 42 mmol | 111 mL | 4 | 27.2 g, 90% |

| Polymer No. | GPC Mw | GPC Mn | PENB/ HexenylNB | terminal to isomerized |
|---|---|---|---|---|
| 5 | 112,000 | 16,800 | 79/21 | 1 to 7 |
| 6 | 103,000 | 15,400 | 76/24 | 9 to 1 |
| 7 | 90,700 | 16,600 | 77/23 | 3 to 1 |

Use Example 1

Top Gate OFET with OSC Containing Polynorbornene Binder with Hexenyl (Reactive) Side Groups and Phenyl Ethyl (Non-Reactive) Side Groups Teonex Q65FA® film (available from DuPont Teijin Films™) was washed in methanol.

A 1 micron layer of Lisicon® P014-MAK-175 planarization material was deposited onto the Teonex film via spin coating (1500 rpm, 30 s) followed by 8 min baking at 70° C. and 4 min UV exposure (UVA 0.011 W/cm$^2$, peak at 365 nm).

Approximately 60 nm thick gold source drain electrodes were evaporated onto the Lisicon® P014-MAK-175 layer with parallel plate geometry of 20 µm wide by 1 mm long.

The electrodes were treated with Lisicon® M001 self assembled charge injection material for 1 min, dried and annealed on a hot plate at 70° C. for 2 min.

An OSC formulation, encompassing of (w/w) 1.60% of 2,8-Difluoro-5,11-bis(triethylsilylethynyl)anthra-dithiophene, 0.20% of Polymer I (from Example 1), 78.56% of cyclohexylbenzene and 19.64% of mesitylene, was then printed as a 5×5 cm wide area block on the array of source/drain electrodes on the film as described above using a RK Flexiproof 100 flexographic printing with a 6 cm$^3$/m$^2$ loaded anilox and a Cyrel HiQS flexo mat running at 70 m/min speed. The printed OSC layer was then annealed at 70° C. for 5 min.

A 800 nm layer of Parylene C was then chemically vapor deposited on the OSC layer using PDS 2010 Labcoter® manufactured by Speciality Coating Systems.

Finally a 40 nm thick gold gate electrode array was evaporated on top of the Parylene C dielectric layer in such a way that it completely covered the active channel of the devices—the area between source and drain electrodes.

The transfer characteristics was recorded at bias voltage of −5 V (linear region) and −60V (saturation region). The transfer characteristics are shown in FIG. 3a.

Then the device was electrically stressed for 12 h using source/gate voltage of 30V and another transfer characteristic at bias voltage of −5 V (linear region) was recorded directly after the stress to compare with the previous characteristic at bias voltage of −5 V from before stress. The comparison of the transfer characteristics recorded before and after stress is shown in FIG. 3b.

Figure 3A:
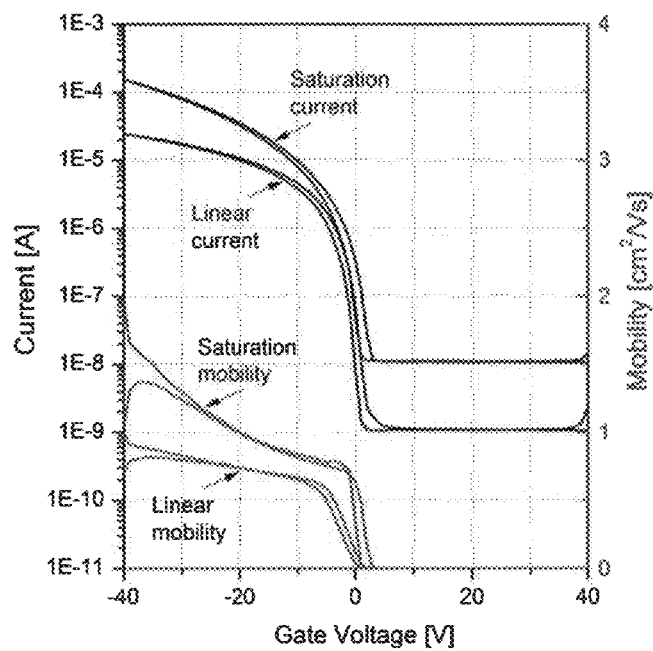
FIG. 3a is a transfer curve of a top gate OFET device of Example 1.
Figure 3B:
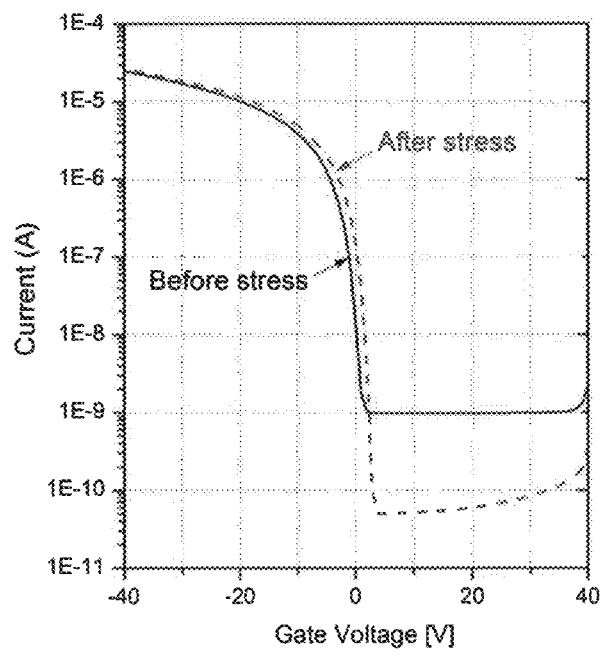
FIG. 3b depicts the transfer characteristics of a top gate OFET device of Example 1 before and after electrical stress.

Transfer characteristics of the transistor shown in FIG. 3a indicate good transistor performance with hole mobilities greater than 0.5 cm$^2$/Vs. From FIG. 3b it can be seen that the OFET device of Example 1 is electrically stable and only minor threshold voltage shift can be observed.

Adhesion of Parylene C to the OSC film was measured using Mecmesin MultiTest-i adhesion test system. For that purpose an adhesive tape (of suitable tack and define width: Tesa® 4965) was applied to the top surface of the Parylene film and held at a 90° angle by a clamp connected to a load cell. During the measurement the test platform moved at a preset speed whilst peeling the tape off the substrate. The platform motion maintained the tape perpendicular to the test sample. The resultant force required to peel off the top layer was recorded by a 10 N load cell and used to quantify adhesion between the two films.

As a result the adhesion force of the Parylene C to the OSC film described in that example was in the range of 0.3-0.5 N, whereas the adhesion of 5,11-Bis(triethylsilylethynyl)anthra-dithiophene and blends of that materials with commonly used binders as polystyrene, poly(4-metylstyrene), poly(α-methylstyrene), poly(4-vinylbiphenyl), and poly(triarylamine) is close to 0 N (typically below the detection limit). This shows that presence of Polymer 1 in the OSC film significantly improved adhesion of Parylene C to the OSC film.

Use Example 2

Top Gate OFET with OSC Containing Polynorbornene Binder with Hexenyl (Reactive) Side Groups and Phenyl Ethyl (Non-Reactive) Groups Teonex Q65FA® film (available from DuPont Teijin Films™) was washed in methanol.

A 1 micron layer of Lisicon® P014-MAK-175 planarization material was deposited onto the Teonex film via spin coating (1500 rpm, 30 s) followed by 8 min baking at 70° C. and 4 min UV exposure (UVA 0.011 W/cm$^2$, peak at 365 nm).

Approximately 60 nm thick gold source drain electrodes were evaporated onto the Lisicon® P014-MAK-175 layer with parallel plate geometry of 20 µm wide by 1 mm long.

The electrodes were treated with Lisicon® M001 self assembled charge injection material for 1 min, dried and annealed on a hot plate at 70° C. for 2 min.

An OSC formulation, encompassing of (w/w) 1.60% of 2,8-Difluoro-5,11-bis(triethylsitylethynyl)anthradithiophene, 0.20% of Polymer 2 (from Example 2), 78.56% of cyclohexylbenzene and 19.64% of mesitylene, was then printed as a 5×5 cm wide area block on the array of source/drain electrodes on the film as described above using a RK Flexiproof 100 flexographic printing with a 6 cm$^3$/m$^2$ loaded anilox and a Cyrel HiQS flexo mat running at 70 m/min speed. The printed OSC layer was then annealed at 70° C. for 5 min.

A 800 nm layer of Parylene C was then chemically vapor deposited on the OSC layer using PDS 2010 Labcoter® manufactured by Speciality Coating Systems.

Finally a 40 nm thick gold gate electrode array was evaporated on top of the dielectric Parylene C layer in such a way that it completely covered the active channel of the devices—the area between source and drain electrodes.

The transfer characteristics was recorded at bias voltage of −5 V (linear region) and −60V (saturation region). The transfer characteristics are shown in FIG. 4a.

Then the device was electrically stressed for 12 h using source/gate voltage of 30V and another transfer characteristic at bias voltage of −5 V (linear region) was recorded directly after the stress to compare with the previous characteristics at bias voltage of −5 V from before stress. The comparison of the transfer characteristics recorded before and after stress is shown in FIG. 4b.

Figure 4A:
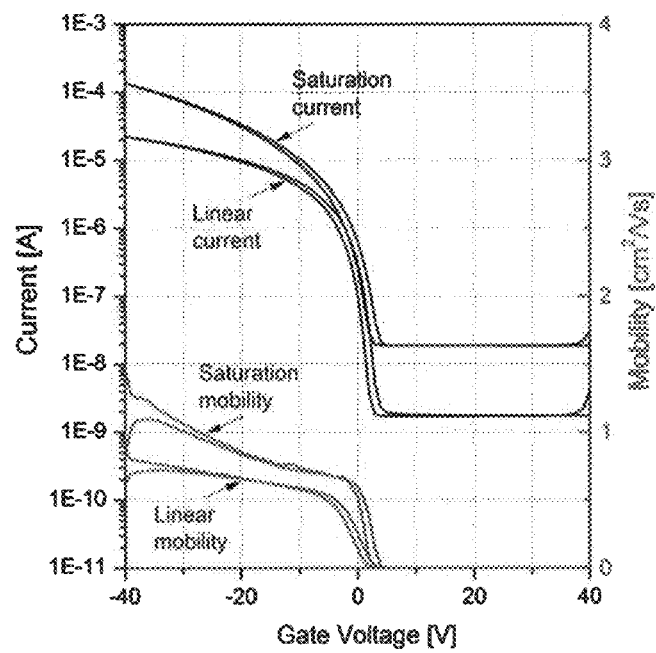
FIG. 4a is a transfer curve of a top gate OFET device of Example 2.
Figure 4B:
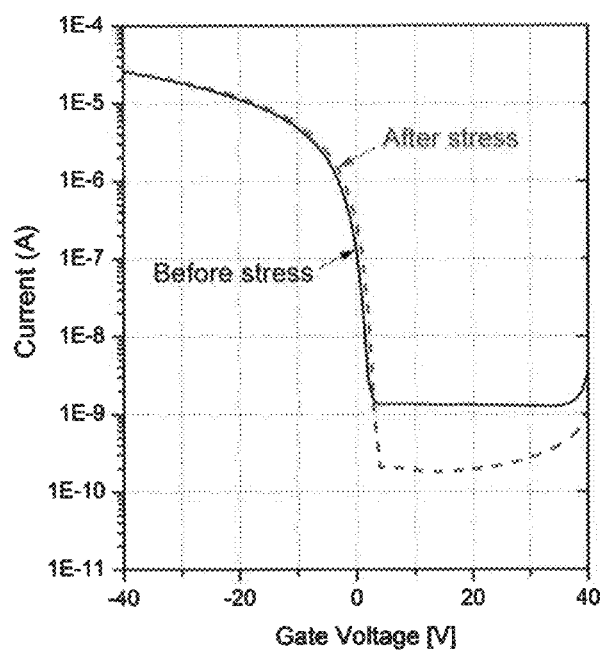
FIG. 4b depicts the transfer characteristics of a top gate OFET device of Example 2 before and after electrical stress.

Transfer characteristics of the transistor shown in FIG. 4a indicate good transistor performance with hole mobilities greater than 0.5 cm$^2$/Vs. From FIG. 4b it can be seen that in the OFET device of Example 1 is electrically stable and only minor threshold voltage shift can be observed.

Adhesion of Parylene C to the OSC film was measured using Mecmesin MultiTest-i adhesion test system. For that purpose an adhesive tape (of suitable tack and define width: Tesa® 4965) was applied to the top surface of the Parylene film and held at a 90°angle by a clamp connected to a load cell. During the measurement the test platform moved at a preset speed whilst peeling the tape off the substrate. The platform motion maintained the tape perpendicular to the test sample. The resultant force required to peel off the top layer was recorded by a 10 N load cell and used to quantify adhesion between the two films.

As a result the adhesion force of the Parylene C to the OSC film described in that example was in the range of 0.4-0.6 N, whereas the adhesion of 5,11-Bis(triethylsilylethynyl)anthradithiophene and blends of that materials with commonly used binders as polystyrene, poly(4-methylstyrene), poly(α-methylstyrene), poly(4-vinylbiphenyl), and poly(triarylamine) is close to 0 N (typically below the detection limit). This shows that presence of Polymer 2 in the OSC film significantly improved adhesion of Parylene C to the OSC film.

Use Example 3

An OSC film was prepared as described in Use Example 1, using the polymers 5-7 of Examples 5-7. Adhesion of Parylene C to the OSC film was measured using Mecmesin MultiTest-i adhesion test system. For that purpose an adhesive tape (of suitable tack and define width: Tesa® 4965) was applied to the top surface of the Parylene film and held at a 90°angle by a clamp connected to a load cell. During the measurement the test platform moved at a preset speed whilst peeling the tape off the substrate. The platform motion maintained the tape perpendicular to the test sample. The resultant force required to peel off the top layer was recorded by a 10 N load cell and used to quantify adhesion between the two films.

As a result the adhesion force of the Parylene C to the OSC film described in that example was in the range of 0.4-0.6 N.

We claim:

1. A formulation comprising an organic semiconductor (OSC) and a polycycloolefinic polymer comprising one or more pendant reactive groups.

2. The formulation according to claim 1, wherein the reactive group comprises a hydroxyl portion or an olefinic portion that can crosslink with Parylene.

3. The formulation according to claim 1, wherein the polycycloolefinic polymer is a norbornene-type polymer having one or more distinct types of repeating units of Formula I

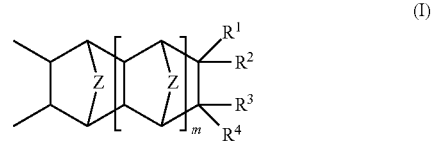

wherein Z is selected from —CH$_2$—, —CH$_2$—CH$_2$— or —O—, m is an integer from 0 to 5, each of R$^1$, R$^2$, R$^3$ and R$^4$ are independently selected from H, a C$_1$ to C$_{25}$ hydrocarbyl, a C$_1$ to C$_{25}$ halohydrocarbyl or a C$_1$ to C$_{25}$ perhalocarbyl group, and wherein in at least one repeating unit one or more of R$^{1-4}$ denote or comprise a reactive group.

4. The formulation according to claim 1, wherein the polycycloolefinic polymer comprises one or more repeating units selected from the following formulae

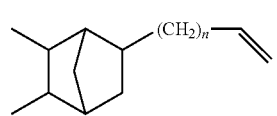

P1

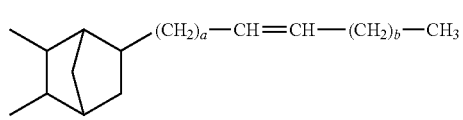

P2

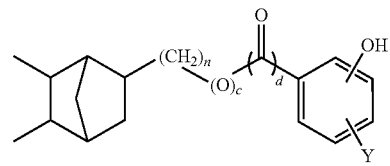

P3

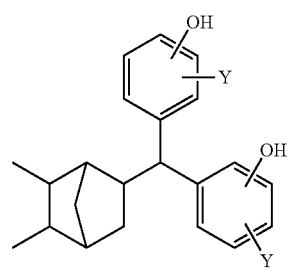

P4

-continued

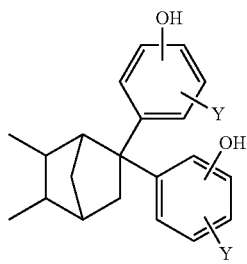
P5 where Y is alkyl or alkoxy with 1 to 20 C atoms or alkyl-carbonyl with 2 to 20 C atoms, n is an integer from 0 to 8, a and b are independently of each other an integer from 0 to 7, wherein a+b≤7, and c and d are independently of each other 0 or 1.

5. The formulation according to claim 4, wherein the polycycloolefinic polymer comprises one or more repeating units selected from the following formulae

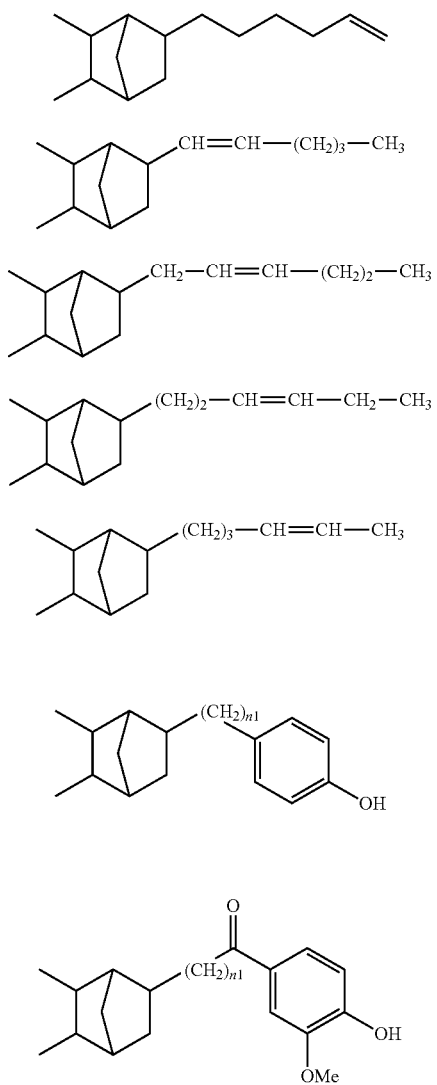

-continued

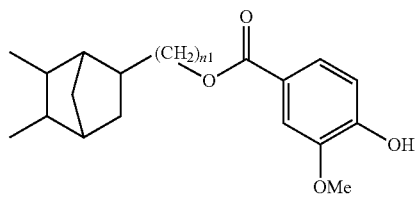
P3c

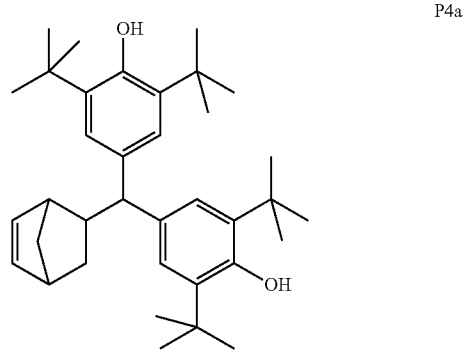
P4a where n1 is 0, 1, 2, 3, 4 or 5, a and b are independently of each other an integer from 0 to 7, and wherein a+b≤7.

6. The formulation according to claim 4, wherein the polycycloolefinic polymer comprises one or more repeating units selected from the following formulae

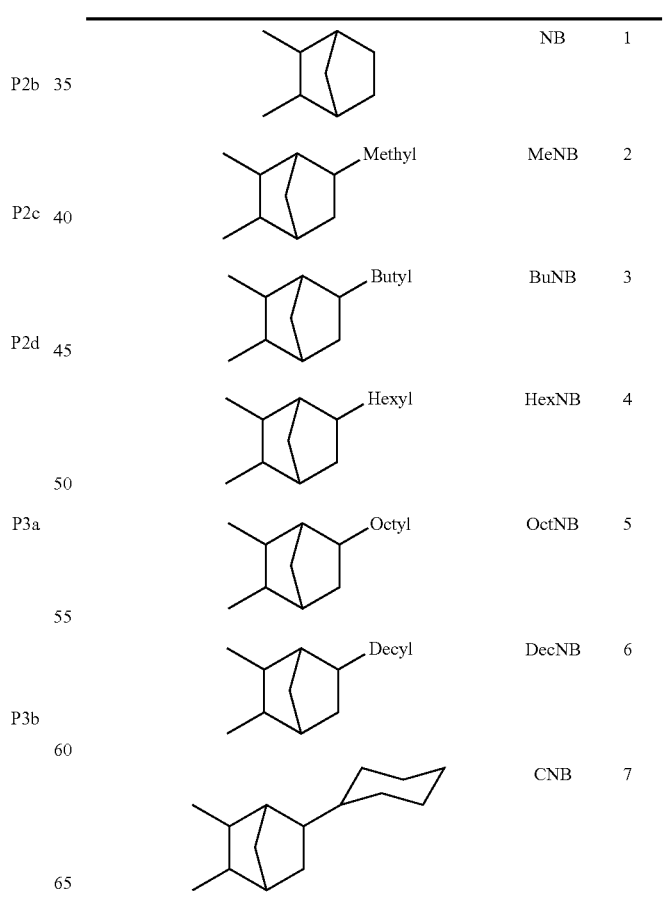

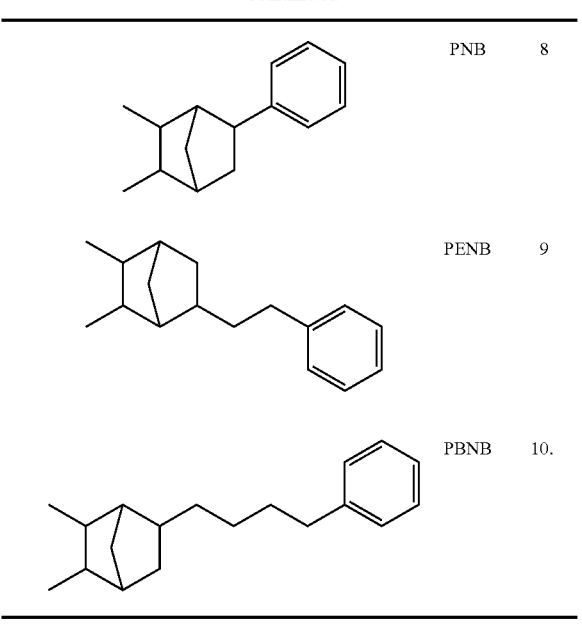
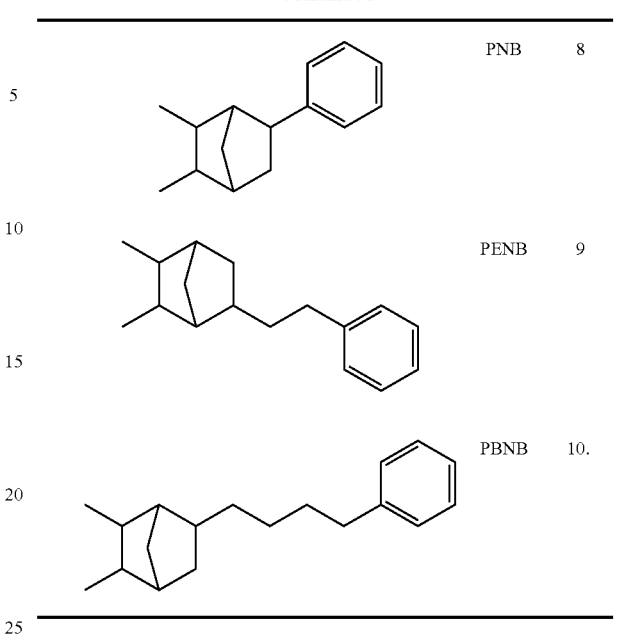
7. The formulation according to claim 5, wherein the polycycloolefinic polymer comprises one or more repeating units selected from the following formulae
8. The formulation according to claim 5, wherein the polycycloolefinic polymer comprises one or more repeating units selected from the following formulae
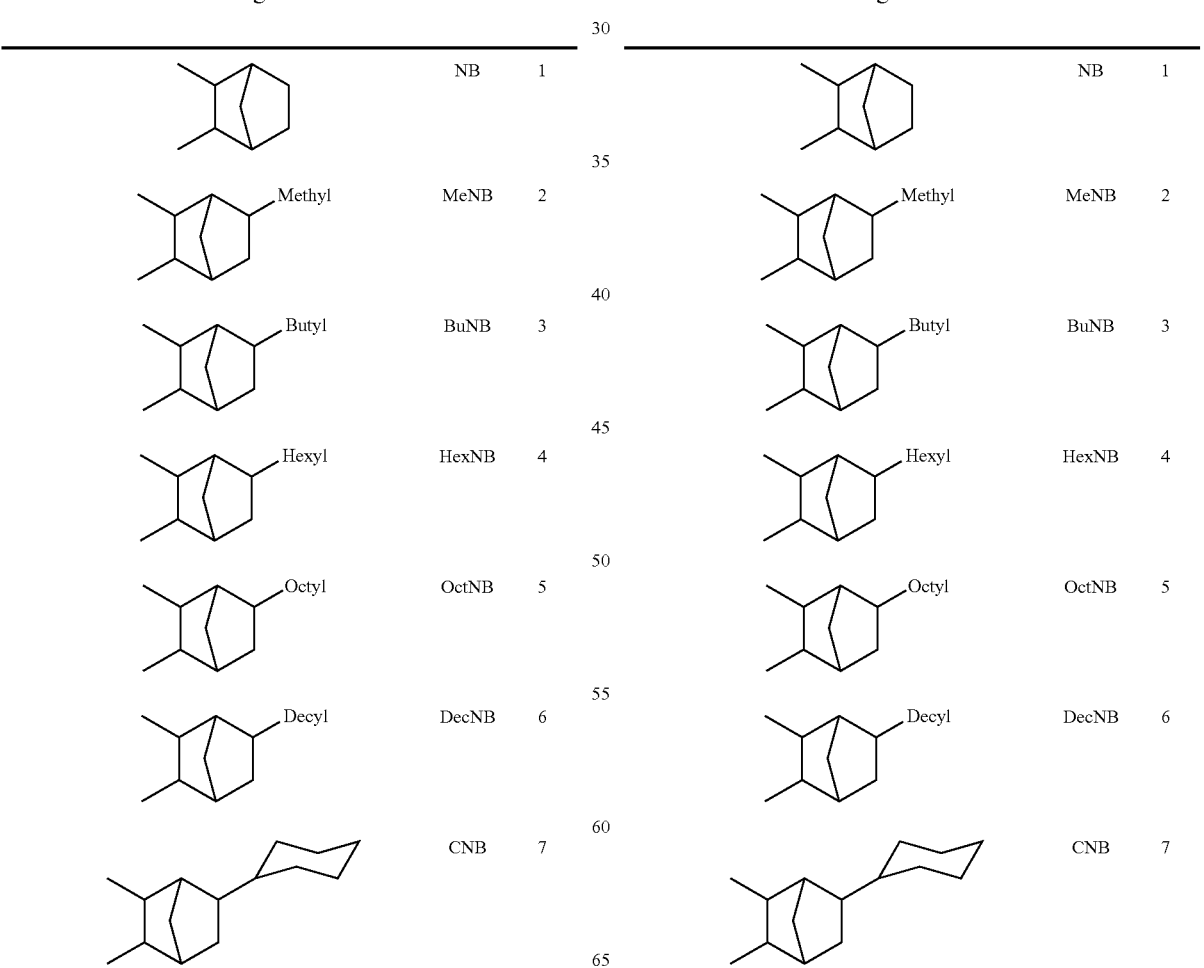

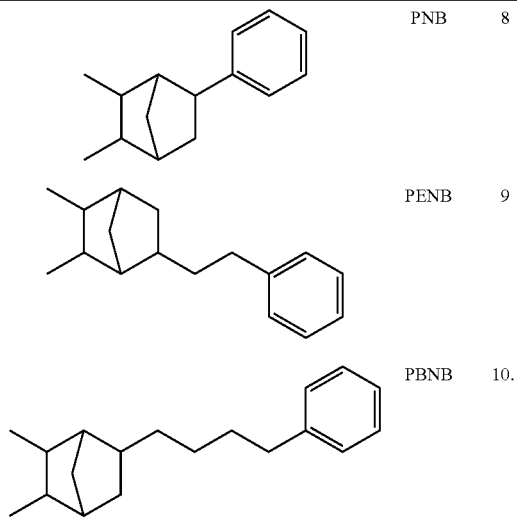

9. The formulation according to claim 1, wherein the OSC comprises a small molecule.

10. The formulation according to claim 9, wherein the OSC comprises an oligoacene that is optionally substituted with two or more alkylsilylethynyl groups.

11. The formulation according to claim 1, further comprising one or more organic solvents.

12. The formulation according to claim 11, wherein the organic solvent is selected from cyclohexylene, mesitylene, xylene, diethylbenzene, indane and tetralin.

13. An OSC layer obtained through the use of a formulation according to claim 1.

14. A process of preparing an OSC layer, comprising depositing a formulation according to claim 1 onto a substrate and, in case the formulation comprises a solvent, removing the solvent.

15. An organic electronic (OE) device comprising an OSC layer that is formed from a formulation comprising an organic semiconductor (OSC) and a polycycloolefinic polymer that includes one or more pendant reactive groups, said OE device further comprising a dielectric or passivation layer obtained by vapor deposition of a p-xylylene onto said OSC layer.

16. A process of preparing an OE device according to claim 15, comprising providing a dielectric or passivation layer obtained by vapor deposition of a p-xylylene onto said OSC layer.

17. A process of preparing an OE device according to claim 15, comprising
depositing a formulation comprising an organic semiconductor (OSC) and a polycycloolefinic polymer comprising one or more pendant reactive groups onto a substrate to form an OSC layer, and if the formulation includes a solvent, removing the solvent,
optionally annealing the OSC layer, and
depositing a layer of a p-xylylene onto the OSC layer by vapor deposition.

18. The organic electronic device according to claim 15, which is an Organic Field Effect Transistor (OFET), Organic Thin Film Transistor (OTFT), Organic Light Emitting Diode (OLED) or Organic Photovoltaic (OPV) device or Organic Photodetector (OPD).

19. The organic electronic device according to claim 18, which is a top gate OFET or bottom gate OFET.

20. The organic electronic device according to claim 19, wherein the top gate OFET comprises a substrate (1), source and drain electrodes (2a, 2b), an OSC layer (3) obtained with a formulation comprising an organic semiconductor (OSC) and a polycycloolefinic polymer comprising one or more pendant reactive groups, a dielectric layer (4) comprising a poly(p-xylylene) and serving as gate insulator, and gate electrode (5).

21. A process for preparing an OFET according to claim 20, which comprises:
forming source and drain electrodes (2a,2b) on a substrate (1),
forming an OSC layer (3) from a formulation comprising an organic semiconductor (OSC) and a polycycloolefinic polymer comprising one or more pendant reactive groups on the source and drain electrodes (2a, 2b),
forming a dielectric layer (4) by vapor deposition of a p-xylylene on the OSC layer (3),
forming a gate electrode (5) on the dielectric layer (4).

22. The organic electronic device according to claim 19, wherein the bottom gate OFET comprises a substrate (1), a gate electrode (5), a dielectric layer (4) serving as gate insulator, source and drain electrodes (2a, 2b), an OSC layer (3) obtained with a formulation comprising an organic semiconductor (OSC) and a polycycloolefinic polymer comprising one or more pendant reactive groups, and a passivation layer (6) comprising a poly(p-xylylene).

23. A process for preparing an OFET according to claim 22, which comprises:
forming a gate electrode (5) on a substrate (1),
forming a dielectric layer (4) on the the substrate (1) and the gate electrode (5),
forming source and drain electrodes (2a,2b) on the dielectric layer (4).
forming an OSC layer (3) from a formulation comprising an organic semiconductor (OSC) and a polycycloolefinic polymer comprising one or more pendant reactive groups on the source and drain electrodes (2a, 2b) and the dielectric layer (4),
forming a passivation layer (6) by vapor deposition of a p-xylylene on the OSC layer (3).

24. A product or assembly comprising an OE device according to claim 15, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

* * * * *